United States Patent [19]
Miles

[11] Patent Number: 6,047,836
[45] Date of Patent: Apr. 11, 2000

[54] CARD GUIDE WITH AIRFLOW SHUTTERS

[75] Inventor: Michael D. Miles, Portland, Oreg.

[73] Assignee: Tektronix, Inc., Wilsonville, Oreg.

[21] Appl. No.: 08/899,245

[22] Filed: Jul. 23, 1997

[51] Int. Cl.$^7$ .............................. A47G 19/08; H05K 7/20
[52] U.S. Cl. ...................... 211/41.17; 361/690; 361/695
[58] Field of Search ................. 211/41.17; 361/690–695

[56] References Cited

U.S. PATENT DOCUMENTS

| | | | |
|---|---|---|---|
| 3,762,574 | 10/1973 | Bentley et al. | 211/41.17 |
| 3,956,673 | 5/1976 | Seid | 361/690 |
| 4,502,099 | 2/1985 | Manes et al. | 361/383 |
| 4,607,751 | 8/1986 | Straccia, Sr. et al. | 211/41.17 |
| 4,648,007 | 3/1987 | Garner | 361/384 |
| 4,672,509 | 6/1987 | Speraw | |
| 4,690,286 | 9/1987 | Horne et al. | 211/41.17 |
| 5,101,320 | 3/1992 | Bhargava et al. | 361/384 |
| 5,120,919 | 6/1992 | Bruges | 361/384 X |
| 5,172,306 | 12/1992 | Cantrell | 211/41.17 |
| 5,187,648 | 2/1993 | Ho | 211/41.17 |
| 5,259,516 | 11/1993 | Ellis | 211/41.17 |
| 5,412,534 | 5/1995 | Cutts et al. | 361/695 |
| 5,493,474 | 2/1996 | Schkrohowsky et al. | 361/695 |
| 5,497,288 | 3/1996 | Otis et al. | 361/695 |
| 5,528,455 | 6/1996 | Miles | 361/695 |
| 5,638,259 | 6/1997 | McCarthy et al. | 361/695 |

FOREIGN PATENT DOCUMENTS

| | | |
|---|---|---|
| 6489396 | 4/1989 | Japan . |
| 24000 | 1/1990 | Japan . |
| 5299861 | 11/1993 | Japan . |
| 6164179 | 6/1994 | Japan . |

Primary Examiner—Daniel P. Stodola
Assistant Examiner—Jennifer E. Novosad
Attorney, Agent, or Firm—Thomas F. Lenihan

[57] ABSTRACT

A card guide allowing or impeding airflow to a circuit card uses overlapping airflow shutters disposed longitudinally along the bottom of the card guide. The shutters are operated in response to the insertion of a card into the card guide by the action of a panel of the circuit card engaging an actuating member on the card guide assembly. When open, the shutters provide an opening which exceeds fifty percent of the airway.

9 Claims, 6 Drawing Sheets

6,047,836

CARD GUIDE WITH AIRFLOW SHUTTERS

FIELD OF THE INVENTION

The invention concerns card guides in general, and specifically those card guides which allow airflow to cards inserted therein.

BACKGROUND OF THE INVENTION

It is commonplace for manufacturers to provide card racks or enclosures for receiving and supporting circuit cards (sometimes referred to as circuit boards, printed circuit boards (PCBs), or electronic circuit boards (ECBs)). Typically the cards are inserted into slots by sliding them along a card guide which aligns the card edge connector with its mating connector mounted at the back of the enclosure.

The cards have electronic components mounted thereon for performing specific tasks, such as data acquisition, measurement, or signal amplification, for example. Due to normal operation, these cards dissipate power in the form of heat In some cases the amount of heat given off by the cards is very low, and dissipates naturally into the surrounding air. However, in many cases the heat dissipation is of such an extent that the cards need to be cooled by airflow from a fan. Some early prior art card racks installed the fan at one end and the air exhaust ports at the other end, in the hope that the air would circulate around the circuit board components and carry off the heat.

Later prior art card racks, in an effort to better direct the airflow to the circuit cards, mounted the fan at the back of the enclosure to pressurize a plenum which had ports beneath the circuit cards. In this way, the air was blown directly up along the faces of the circuit card. Unfortunately, air was not only directed to occupied slots where it was needed, but also, needlessly, to unoccupied slots. Some method was needed to block the airflow to unoccupied slots, because the air delivered to the unoccupied slots was "wasted" in that it reduced the airflow to the occupied slots. Prior systems solved the problem by filling the otherwise unoccupied slots with dummy loads designed to impede the airflow to those slots. The solution worked reasonably well, but raised its own problem. The dummy loads were temporary fillers only used when a circuit board was not installed. Often they would be replaced in the slot by a working circuit board, and promptly missed. When the need for that particular working circuit board ended, the user would remove it. If, However, the dummy load is mislaid, it cannot be reinserted, which will cause airflow to be, once again, directed to an empty slot.

U.S. Pat. No. 5,528,455 (Miles) MODULAR INSTRUMENT CHASSIS, issued Jun. 18, 1996, and assigned to Tektronix, Inc. Wilsonville, Oreg., describes a ventilating system for circuit card guides which employs movable dampers to automatically direct airflow to occupied slots and impede airflow to unoccupied slots. In this system, the dampers included a plurality of holes which are moved into alignment with a similar plurality of holes formed in the roof plate of an air plenum located beneath the circuit card guides. Thus, insertion of the card causes air to begin flowing to the circuit card. While this system works well, it is limited in three important ways. First, the dampers, when fully opened, block fifty percent of the airway. Second, the dampers when fully closed leak at each seal. Unfortunately, the linear seal length of this system is quite long in that it comprises the sum of the perimeters of each hole in the plenum roof plate. Third, the manufacturing cost and assembly time are significant due to the complexity of the system.

SUMMARY OF THE INVENTION

A card guide allowing or impeding airflow to a circuit card uses overlapping airflow shutters disposed longitudinally along the bottom of the card guide. The shutters are operated in response to the insertion of a card into the card guide by the action of a panel of the circuit card engaging an actuating member on the card guide assembly. When open, the shutters provide an opening which exceeds fifty percent of the airway.

DETAILED DESCRIPTION OF THE EMBODIMENT

Figure 1:
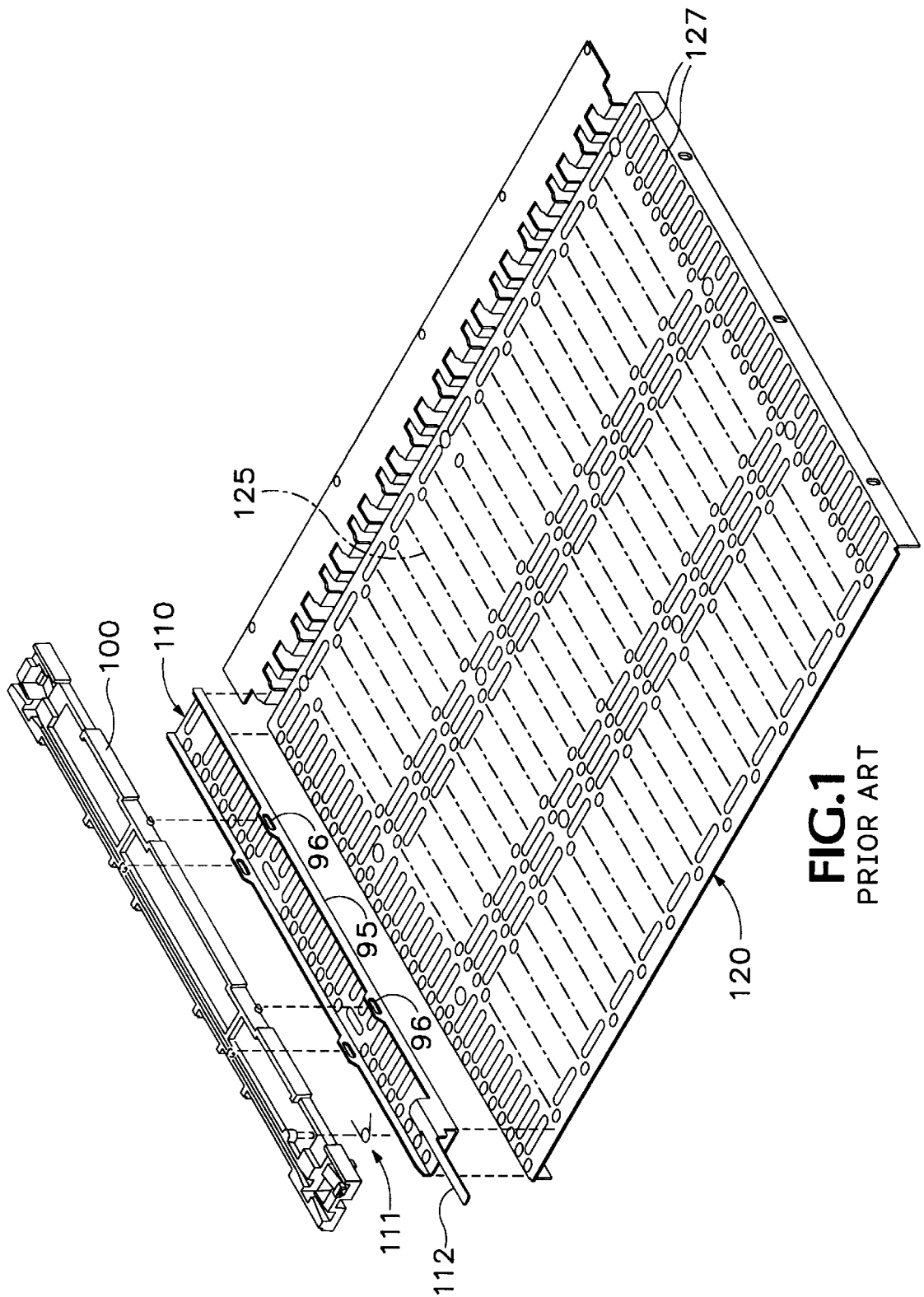
FIG. 1 shows an illustration of a ventilated card guide system as known from the prior art.

Before describing the subject invention, it may be helpful to examine a ventilated card guide according to above-mentioned U.S. Pat. No. 5,528,455. Such a card guide is shown in "exploded view" form in FIG. 1, and comprises three main components, a card guide member 100, a moveable damper 110, and a perforated plate 120. Plate 120 forms the roof of an air plenum (not shown) which lies beneath the row of card guides. The plenum is pressurized by a fan (not shown). Each card slot 125 of plate 120 contains a row of oblong holes 127 through which air passes in an upward direction from the plenum in order to cool a card installed in card guide member 100. If both occupied and unoccupied card slots had open airways from the plenum, then only a small amount of air would be directed to the occupied card slots, where the cooling is needed. That is, air would be ineffectually directed to unoccupied card slots. To alleviate this problem, each card slot has a moveable damper 110 associated with it. Damper 110 is spring loaded by a spring 111 to be in a first, forward position when its card slot is unoccupied, and is slid back to a second position in response to the insertion of a card. Each card has a front panel mounted on it which comes into contact with an actuating member 112 of damper 110, and pushes damper 110 into its second rearward position. When damper 110 is in the first position, its array of holes is non-aligned with the array of holes directly beneath it in plate 120, resulting in an impedance to the flow of air from that particular slot When damper 100 is in the second position, its array of holes is aligned with the array of holes directly beneath it in plate 120, resulting in a flow of air to the circuit board in that particular slot Note that with this arrangement the metal portion of damper 110 between the holes of the damper, has to be wide enough to cover the holes in plate 120 when the damper is closed. Thus, the maximum open airway that this damper arrangement can provide is about 50%. That is, when fully open, half of the otherwise available airway beneath the card guide remains blocked.

Figure 2:
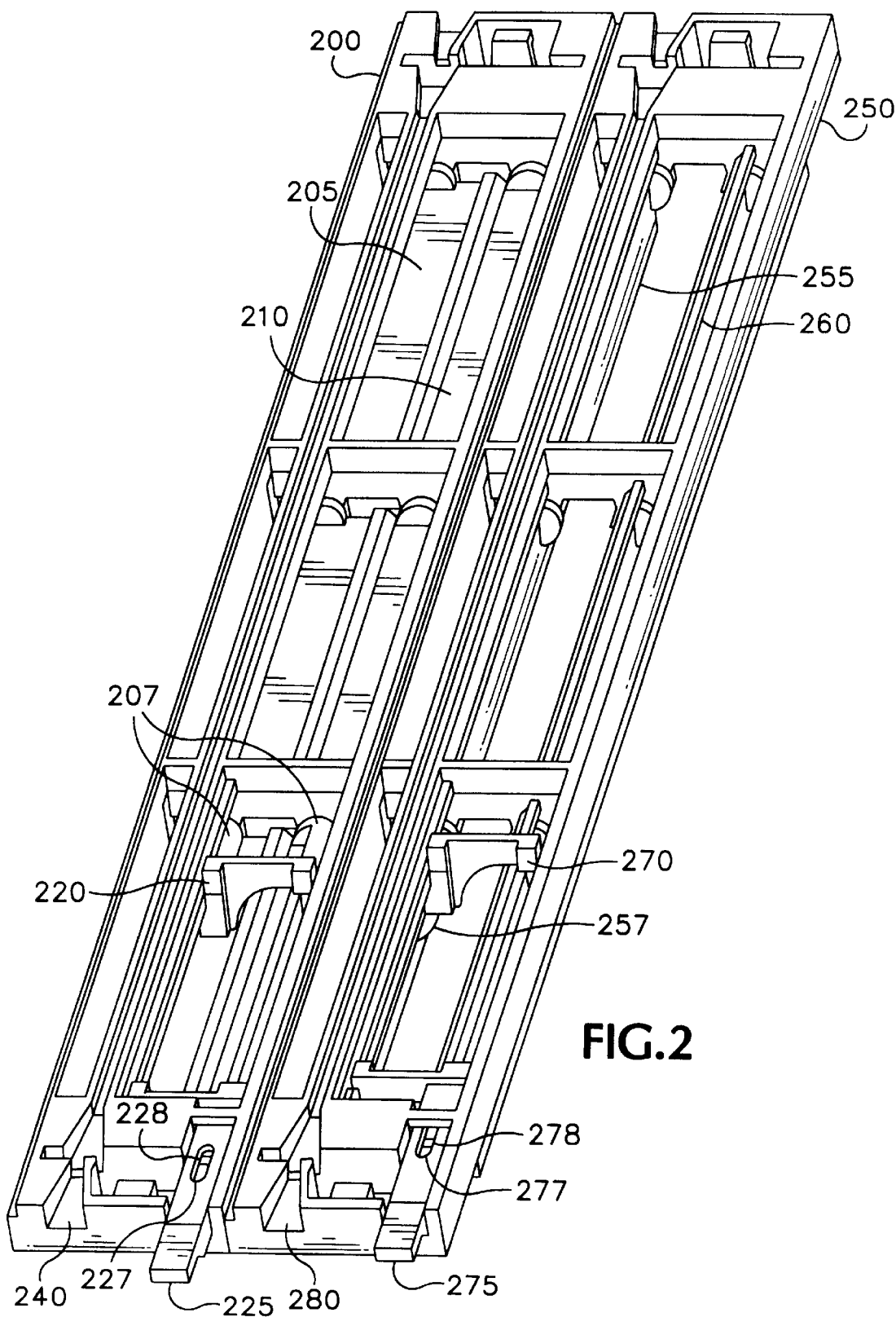
FIG. 2 shows a top view of a pair of card guides according to the subject invention.

FIG. 2 shows a pair of card guides 200, 250 according to the subject invention placed side-by-side. Card guide 200 is shown in the closed position. Card guide 250 is shown in the open position. The card guides have the following additional components mounted therein, a pair of doors 205,210 and 255,260, and a spring loaded actuating member 220, 270. In this regard, note that a tension spring 227 ,277 is visible through an opening 228, 278 in the actuating member. Tension spring 227, 277 is attached at one end to card guide 200, 250 and at the other end to moveable actuating member 220, 270, each of actuating members 220, 270 having a respective tab 225, 275.

Figure 5:
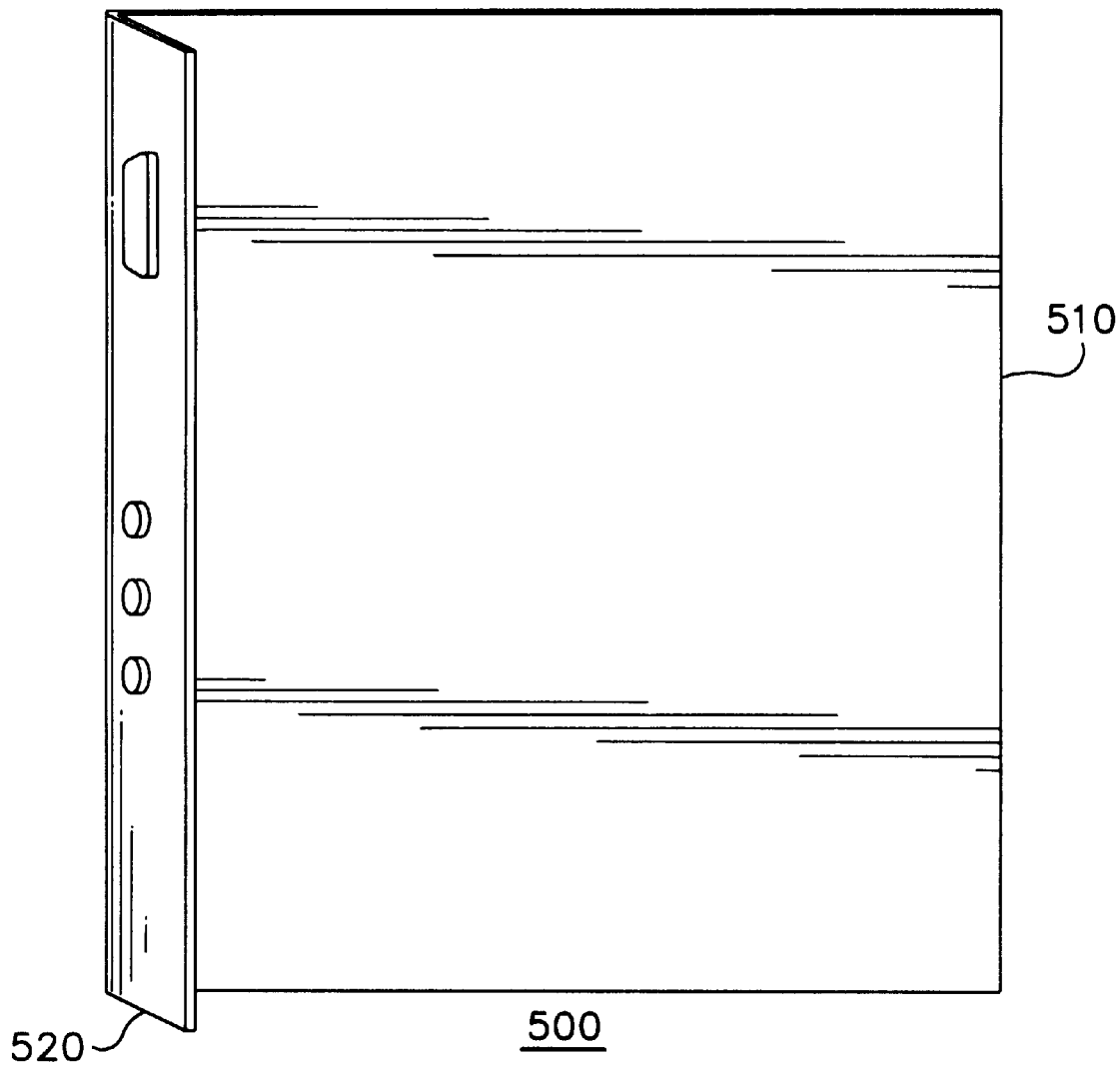
FIG. 5 shows a circuit card having a perpendicularly-mounted front panel suitable for use with the invention.

Advantageously, when the doors (or shutters, or louvers, or vanes) are open, approximately 95% of the available airway is unimpeded to the flow of air. In operation, tab 225,275 of actuating member 220,270 is contacted by a panel of a circuit board as it is being inserted into a card guide track 240,280 of card guide 200,250, as described above with respect to the prior art ventilated card guide. Such a circuit card 500 is shown in FIG. 5 wherein the electronic circuit board 510 has mounted thereon a front panel 520.

Figure 4:
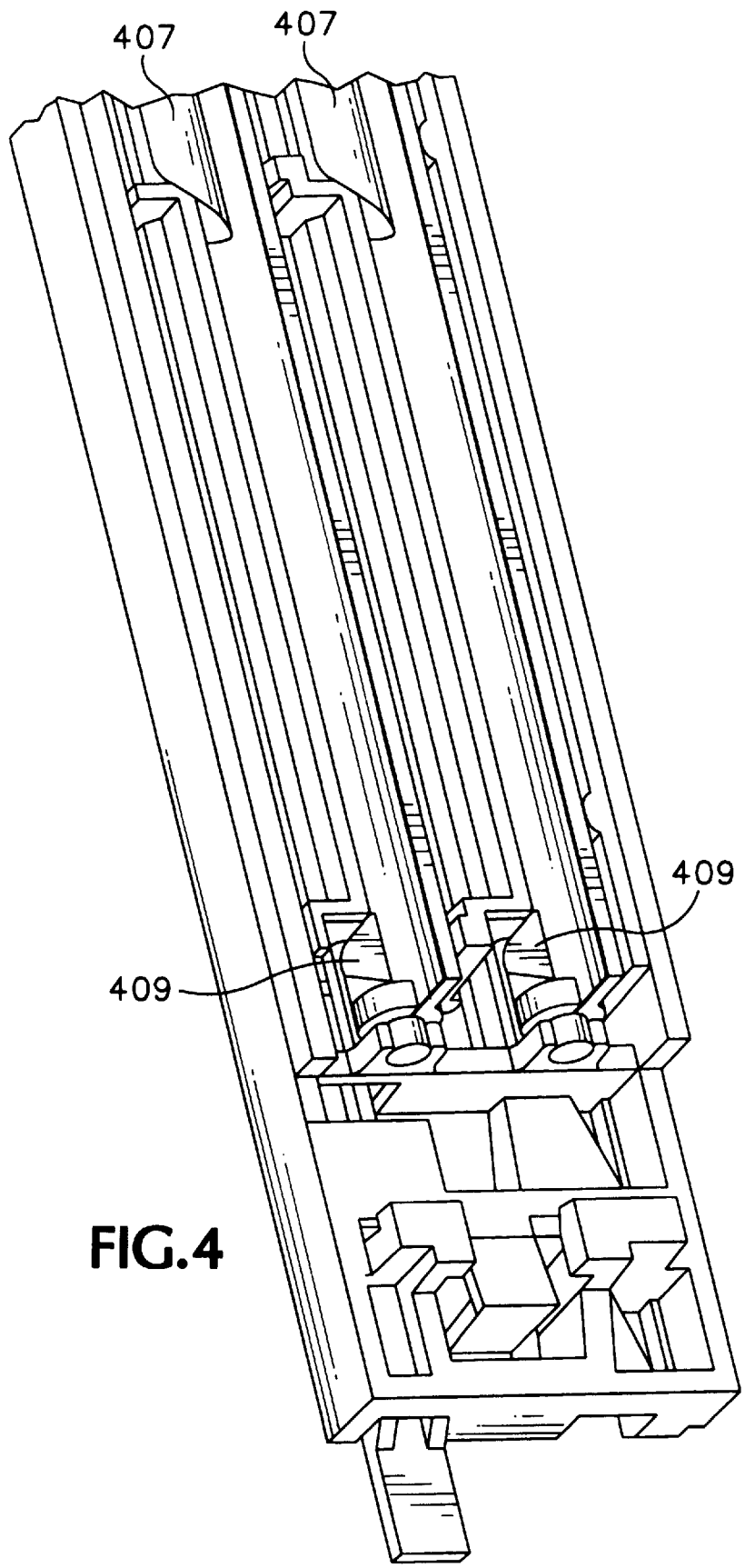
FIG. 4 shows a detailed view of a portion of a card guide in accordance with the invention.

Further insertion of the card moves actuating member 220,270 in a rearward direction until it contacts a portion of a cylindrical cam section disposed on doors 255, 260. These cams may be better seen as cams 207 on card guide 200, or as best shown in FIG. 4 as element 407. As the actuating member 270 is urged farther rearward the doors are rotated ninety degrees to an open position by action of the actuating member against the cylindrical cams. Overtravel is provided for by allowing the actuating member to slide along a straight section of cam 257, so that no further rotation of the doors is caused for by additional amount of rearward travel. In practice, a actuator travel of 0.375 inches is required to fully open the vanes, but a full 0.750 inches of travel is available.

When a card is removed from its card slot, spring loaded actuating member 270 begins to retract toward the front of the card guide. The vanes will remain open until the actuating member contacts a second cylindrical cam mounted at the front of each vane. The second set of cylindrical cams is better seen with respect to FIG. 4. Each of forward cylindrical cams 409 is arranged to cooperate with its respective actuating member to close the vanes by rotating the vane as the actuating member moves along the cam.

Note that, when door 255 is fully open, that it is aligned directly under card guide track 280, thus minimizing the impedance to air flow. The longitudinal vanes when open, also serve to guide the air along the slot, creating a slot to slot separation.

Note that some leakage will occur along the seal length where the doors overlap when closed. This leakage, however, is far less than in the prior art arrangement because the seal length of the subject invention is much shorter than the seal length of the prior art arrangement This is true because the seal length of the prior art arrangement is equal to the perimeters of all of the holes in each slot of plate 120. Because of this fact, it is important to note that there is a greater ratio of open airway to seal edges (gaps), than in the prior art.

A further advantage of the subject card guide is that it is self supporting and needs no plate beneath it. That is, the bottoms of all the card guides in the rack, placed side-by-side, form the roof of the plenum. Thus, the expense of manufacturing such a perforated plenum roof member is eliminated.

One skilled in the art will quickly recognize that for a given fan size, a system using the subject invention will deliver a greater flow of air to the desired locations due to the larger open airway. Conversely, the features of the subject invention dictate that the same airflow (as in the prior art example) can be achieved by use of a smaller fan.

Figure 3:
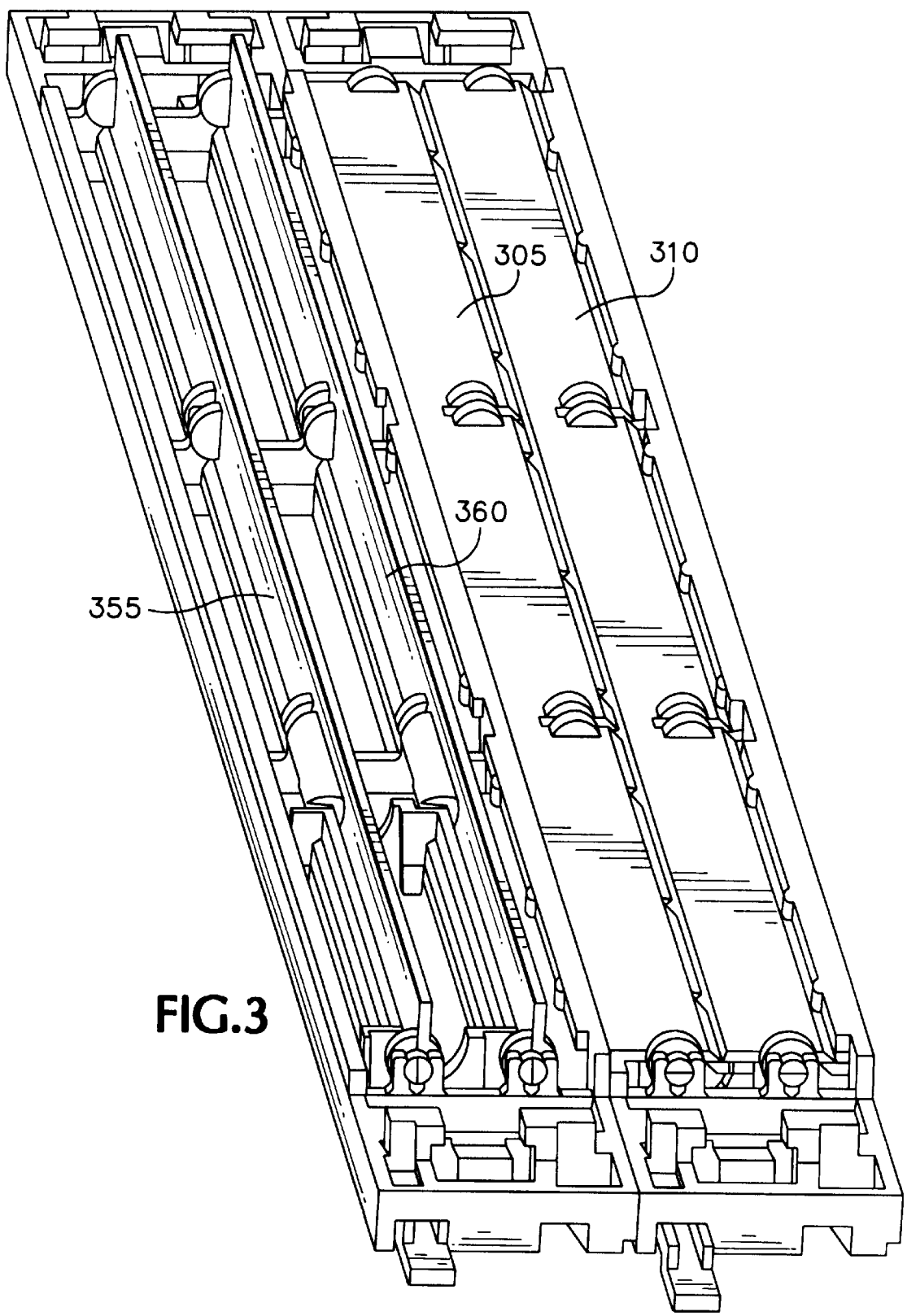
FIG. 3 shows a bottom view of a pair of card guides according to the subject invention.

FIG. 3 shows that vanes 305, 310 and 355,360 are identical, making assembly easier and less expensive. Moreover, the assembly has been designed to "fail to safe". Note that the vanes are not spring-loaded to a closed condition, but rather are driven back by the retracting actuating member. In the event that the spring fails, the vanes will remain open, a safe condition for the circuit boards mounted above. Note that the vanes shown in FIG. 3 both move in the same direction.

Finally, it is noted that certain boards are double wide, or even triple wide, meaning that the components mounted on such boards extend over more than one slot. Additional airways can be automatically opened under such circuit boards because the present system operates in response to the presence of a circuit card front panel, and not merely in response to the presence of a card in the slot. Thus, to open an additional airway, it is only necessary to extend the front panel of the circuit board so that it will contact and depress two or more adjacent actuating members.

While a system having two vanes is shown and described, one skilled in the art will realize that the invention is not so limited and in fact is equally applicable to systems having from at least one to any reasonable number of vanes, limited by the available space in the airway, and width of the vanes. Such systems having more or less than two vanes are therefore deemed to lie within the scope of the following claims.

Figure 6:
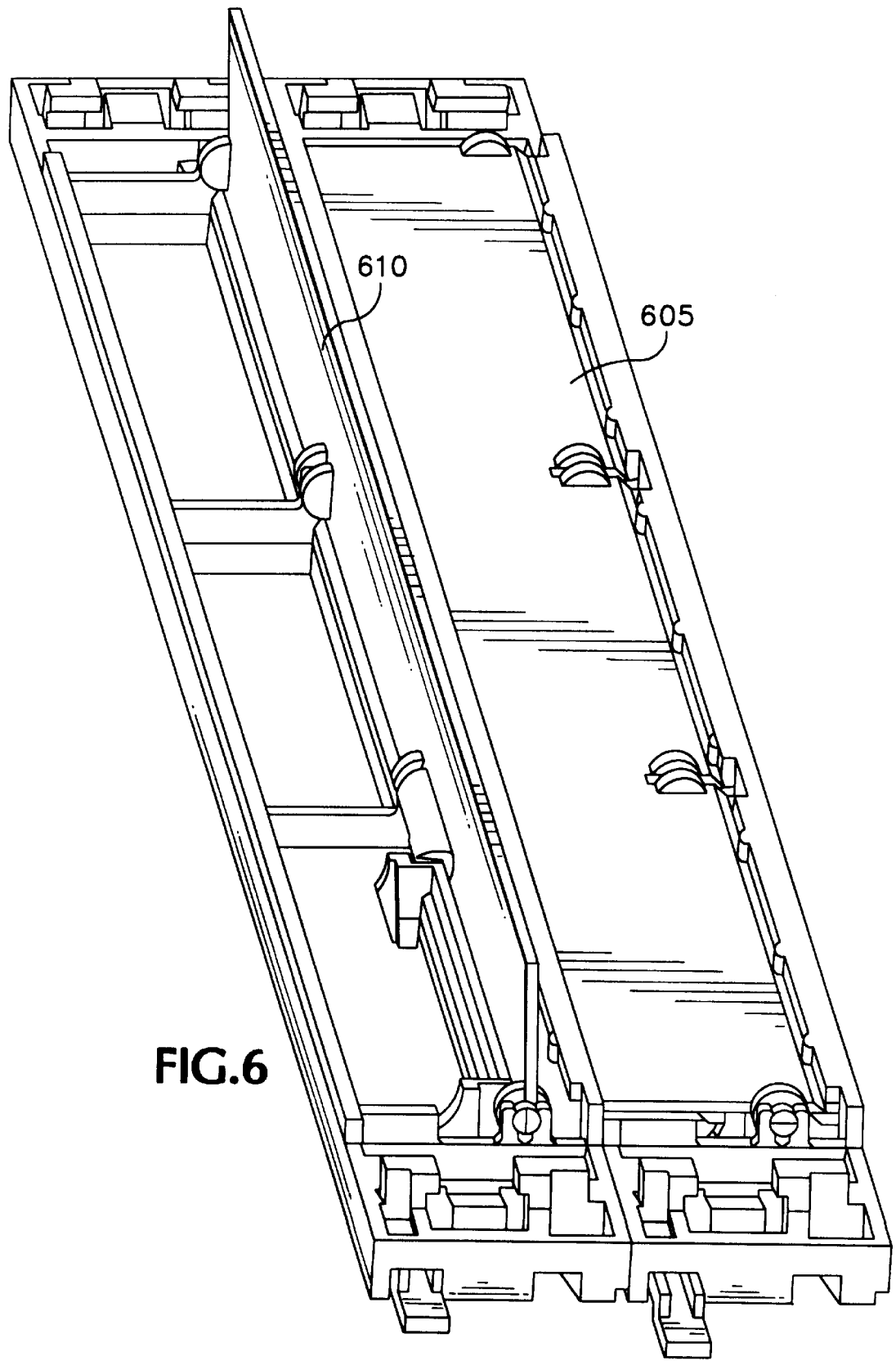
FIG. 6 shows a bottom view of a pair of card guides according to another embodiment of the subject invention.

FIG. 6 shows a bottom view of a pair of card guides each having only a single vane 605, 610. Vane 605 is shown in the closed position, and vane 610 is shown in the open position.

What is claimed:

1. A card guide for controlling airflow therethrough, comprising:

a card track formed in said card guide for receiving a circuit card;

an airflow vane rotatably mounted in said card guide for movement from a first position for substantially blocking the passage of air through said card guide, to a second position for allowing the passage of air through said card guide; and an actuating member disposed for movement along said card guide from a first position substantially at a first end of said card guide to a second position away from said first end of said card guide, and spring loaded to urge said actuating member to return to said first position;

said actuating member engaging said vane and causing said vane to rotate to an open condition in response to insertion of said circuit card, said circuit card having a perpendicularly-mounted front panel for contacting said actuating member; wherein said vane has first and second cylindrical cam sections disposed thereon; and said actuating member contacts said first cylindrical cam section to cause said rotation of said vane to said open condition, and contacts said second cylindrical cam section to cause rotation of said vane to a closed position.

2. The card guide of claim 1, wherein:

said vane when open provides an airway which is greater than 50% of an area of said card guide.

3. The card guide of claim 1, wherein:

said vane also includes a straight section parallel to said vane and coupled to said first cylindrical cam section for contacting said actuating member after said actuating member leaves contact with said first cylindrical cam section, said vane being rotated to an open position by movement of said actuating member against said first cylindrical cam section, said straight section providing a straight path over which said actuating member can travel without causing further rotation of said vane.

4. A card guide having an apparatus for controlling airflow through said card guide, said card guide comprising:

a card track formed in said card guide for receiving a circuit card;

a pair of airflow vanes rotatably mounted in said card guide for movement in the same direction from a first position for substantially blocking the passage of air through said card guide, to a second position for allowing the passage of air through said card guide and to said circuit card; and an actuating member disposed for movement along said card guide from a first position substantially at a first end of said card guide to a second position away from said first end of said card guide, and spring loaded to urge said actuating member to return to said first position;

said actuating member moving from said first position to said second position, engaging said vanes, and causing said vanes to rotate to an open condition in response to insertion of said circuit card, said circuit card having a perpendicularly-mounted front panel for contacting said actuating member; wherein said vanes have first and second cylindrical cam sections disposed thereon; and said actuating member contacts said first cylindrical cam section to cause said rotation of said vanes to said open condition, and contacts said second cylindrical cam section to cause rotation of said vanes to a closed position.

5. The card guide of claim 4, wherein:

said vanes when open provide an airway which is greater than 50% of an area of said card guide.

6. The card guide of claim 4, wherein:

each of said vanes also includes a straight section parallel to said vanes and coupled to said first cylindrical cam section for contacting said actuating member after said actuating member leaves contact with said first cylindrical cam section, said vanes being rotated to an open position by movement of said actuating member against said first cylindrical cam section, said straight section providing a straight path over which said actuating member can travel without causing further rotation of said vanes.

7. A card guide having an apparatus for controlling airflow through said card guide, said card guide comprising:

a card track formed in said card guide and extending along the length of said card guide substantially from a first end of said card guide to a second end of said card guide for receiving a circuit card;

a pair of airflow vanes rotatably mounted in said card guide for movement from a first position for substantially blocking the passage of air through said card guide, to a second position for allowing the passage of air through said card guide to cool said circuit card; and an actuating member disposed for movement along said card guide from a first position substantially at said first end of said card guide to a second position away from said first end of said card guide, and spring loaded to urge said actuating member to return to said first position;

said actuating member engaging said vanes and causing said vanes to rotate to an open condition in response to insertion of a circuit card having a perpendicularly-mounted front panel for contacting said actuating member; wherein said vanes have first and second cylindrical cam sections disposed thereon; and said actuating member contacts said first cylindrical cam section to cause said rotation of said vanes to said open condition, and contacts said second cylindrical cam section to cause rotation of said vanes to a closed position.

8. The card guide of claim 7, wherein:

said vanes when open provide an airway which is greater than 50% of an area of said card guide.

9. The card guide of claim 7, wherein:

each of said vanes also includes a straight section parallel to said vanes and coupled to said first cylindrical cam section for contacting said actuating member after said actuating member leaves contact with said first cylindrical cam section, said vanes being rotated to an open position by movement of said actuating member against said first cylindrical cam section, said straight section providing a straight path over which said actuating member can travel without causing further rotation of said vanes.

* * * * *